United States Patent
Barina et al.

(10) Patent No.: US 7,344,394 B1
(45) Date of Patent: Mar. 18, 2008

(54) MULTIPLE LOCATION LATCH MECHANISM WITH SINGLE ACTUATION

(75) Inventors: Richard M. Barina, Sebring, FL (US); Derek I. Schmidt, Raleigh, NC (US); James S. Womble, Hillsborough, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/872,987

(22) Filed: Oct. 16, 2007

(51) Int. Cl.
*H01R 13/62* (2006.01)

(52) U.S. Cl. .................... 439/157; 439/157; 361/755; 361/798

(58) Field of Classification Search ........ 439/152–160, 439/372, 327; 361/755, 798, 724–732; 360/137
See application file for complete search history.

(56) References Cited

U.S. PATENT DOCUMENTS

| | | | |
|---|---|---|---|
| 3,813,065 A | 5/1974 | Hallesy | |
| 4,688,131 A | 8/1987 | Noda et al. | |
| 5,816,672 A | 10/1998 | LaPointe et al. | |
| 5,828,646 A | 10/1998 | Jones | |
| 5,848,908 A | * 12/1998 | Katsuma | 439/157 |
| 5,873,745 A | * 2/1999 | Duclos et al. | 439/157 |
| 5,891,080 A | 4/1999 | Skinkle et al. | |
| 6,019,620 A | * 2/2000 | Kodama et al. | 439/157 |
| 6,955,550 B2 | 10/2005 | Schlack | |
| 6,956,745 B2 | 10/2005 | Kerrigan | |
| 7,086,258 B2 | 8/2006 | Fisher et al. | |
| 2004/0077198 A1 | 4/2004 | Schlack | |
| 2005/0207087 A1 | 9/2005 | Fisher et al. | |

FOREIGN PATENT DOCUMENTS

GB 2393582 A 3/2004

* cited by examiner

*Primary Examiner*—Tho D. Ta
(74) *Attorney, Agent, or Firm*—Cantor Colburn LLP; Cynthia S. Byrd

(57) ABSTRACT

A latch mechanism for securing a module in an electronic component chassis includes at least one lever arm attached to the module and rotable between a latched and unlatched position, at least a portion of the lever arm having an interference fit with the chassis when the lever arm is in the latched position. The latch mechanism further includes at least one pawl rotably attached to the module such that when the lever arm is moved to the latched position, the lever arm rotates the pawl into a latched position wherein the pawl has an interference fit with the chassis.

2 Claims, 3 Drawing Sheets

MULTIPLE LOCATION LATCH MECHANISM WITH SINGLE ACTUATION

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to electronic components, and particularly to locking mechanisms for modules of electronic components.

2. Description of Background

Electronic components, for example, servers, include many modules inserted into a chassis and locked into position through the use of one or more locking mechanisms. The modules may include, for example, blowers, power supplies, or the like. The conventional locking mechanisms are capable of locking only one portion of the module in place when engaged. For instance, if it is desired to lock each of four corners of a module in place, four separate locking mechanisms are needed which are engaged separately. As each locking mechanism is separately engaged, each desired area of the module is locked into position. Engaging the separate locking mechanisms causes increased installation time and increases installation process complexity. It increases the potential for error in engagement of one or more of the mechanisms leading to an unsecured module which may in turn cause the module to eject from the server during, for example packaging tests and/or shipping.

SUMMARY OF THE INVENTION

The shortcomings of the prior art are overcome and additional advantages are provided through the provision of a latch mechanism for securing a module in an electronic component chassis including at least one lever arm attached to the module and rotable between a latched and unlatched position, at least a portion of the lever arm having an interference fit with the chassis when the lever arm is in the latched position. The latch mechanism further includes at least one pawl rotably attached to the module such that when the lever arm is moved to the latched position, the lever arm rotates the pawl into a latched position wherein the pawl has an interference fit with the chassis.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which secures a module in an electronic component at multiple locations through a single mechanism. The use of the latch mechanism described herein reduces the time for installation of the module to the electronic component, and by securing the module at multiple locations prevents inadvertent removal of the module from the electronic component.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
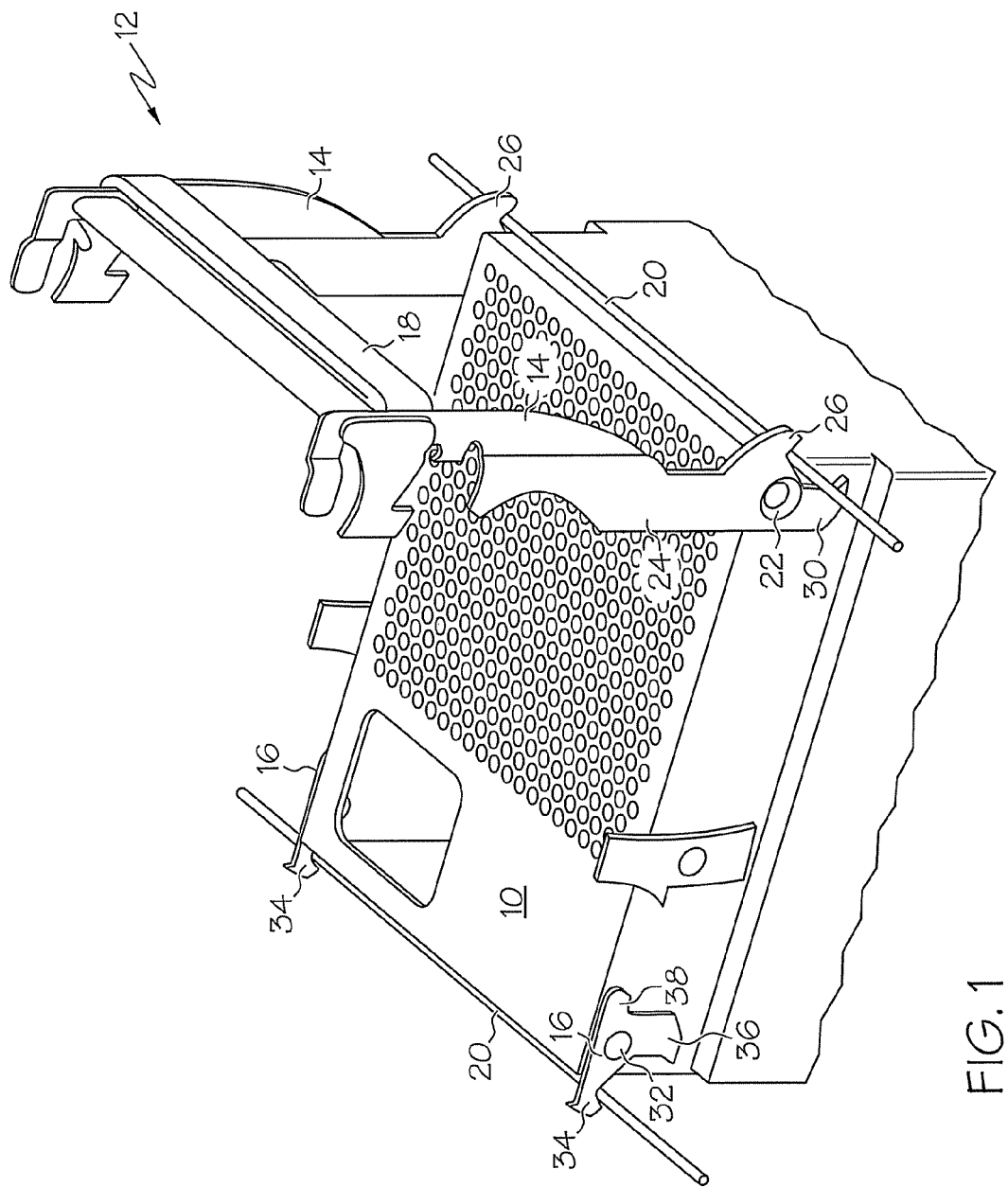
FIG. 1 illustrates a perspective view of an embodiment of a latch mechanism in an unlatched position.

FIG. 1 illustrates an embodiment of a module 10 including a latching mechanism 12. The view in FIG. 1 is of the latch mechanism 12 in an "open" or unlatched position. The latch mechanism 12 is configured with two lever arms 14 connected by a bridge 18, and two pawls 16, which allows for securing the module 10 in a chassis opening 20 at four locations. It is to be appreciated, however, that the latch mechanism 12 is scalable to include any number of sets of lever arms 14 and pawls 16.

At least one lever arm 14 is attached to the module 10 rotably at lever hole 22 disposed at an attachment end 24 of the lever arm 14. The lever arm 14 may be attached by, for example, utilizing a fastener (not shown) inserted through the lever hole 22, placing the lever hole 22 over an integral pin (not shown) in the module 10, or other means. The attachment end 24 also includes a cam lever 26 configured at disposed to prevent the module 10 from being fully inserted into a chassis opening 20, shown here in line form for clarity, when the latch mechanism 12 is in the open position as shown in FIG. 1. The lever arm 14 further includes a lever hook 30 which, when the lever arm 14 is rotated into a "closed" or latched position, interferes with the chassis opening 20.

Similarly, the pawl 16 is rotably attached to the module 10 by, for example, utilizing a fastener (not shown) inserted through a pawl hole 32, placing the pawl hole 32 over an integral pin (not shown) in the module 10, or other means. In some embodiments, the attachment of the pawl 16 to the module 10 is spring loaded such that the default orientation of the pawl 16 is the unlatched position as shown in FIG. 1. The pawl 16 includes a pawl stop 34 configured and disposed to prevent the module 10 from being fully inserted into the chassis opening 20 when the latch mechanism 12 is in the unlatched position. The pawl 16 further includes a pawl hook 36 which, when the pawl 16 is rotated into the latched position, interferes with the chassis opening 20.

Figure 2:
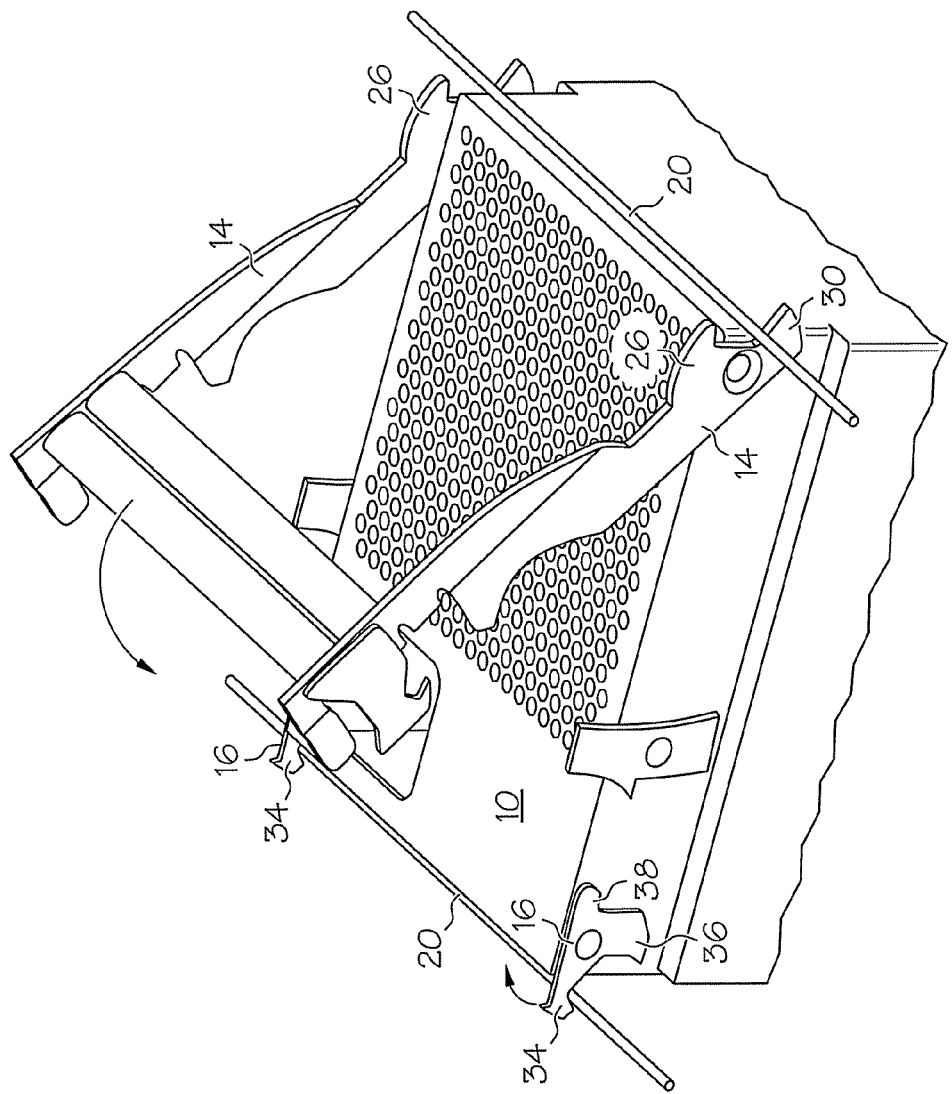
FIG. 2 illustrates the latch mechanism of FIG. 1 as a lever arm is rotating toward a latched position.

To secure the module 10 in the chassis opening 20 utilizing the latch mechanism 12, the module 10 is inserted into the chassis opening 20 with the lever arm 14 and the pawl 16 in the unlatched position. The cam lever 26 and the pawl stop 34 interfere with the chassis opening 20 and prevent the module 10 from being fully seated in the chassis opening 20. As shown in FIG. 2, the lever arm 14 is rotated toward the module 10.

Figure 3:
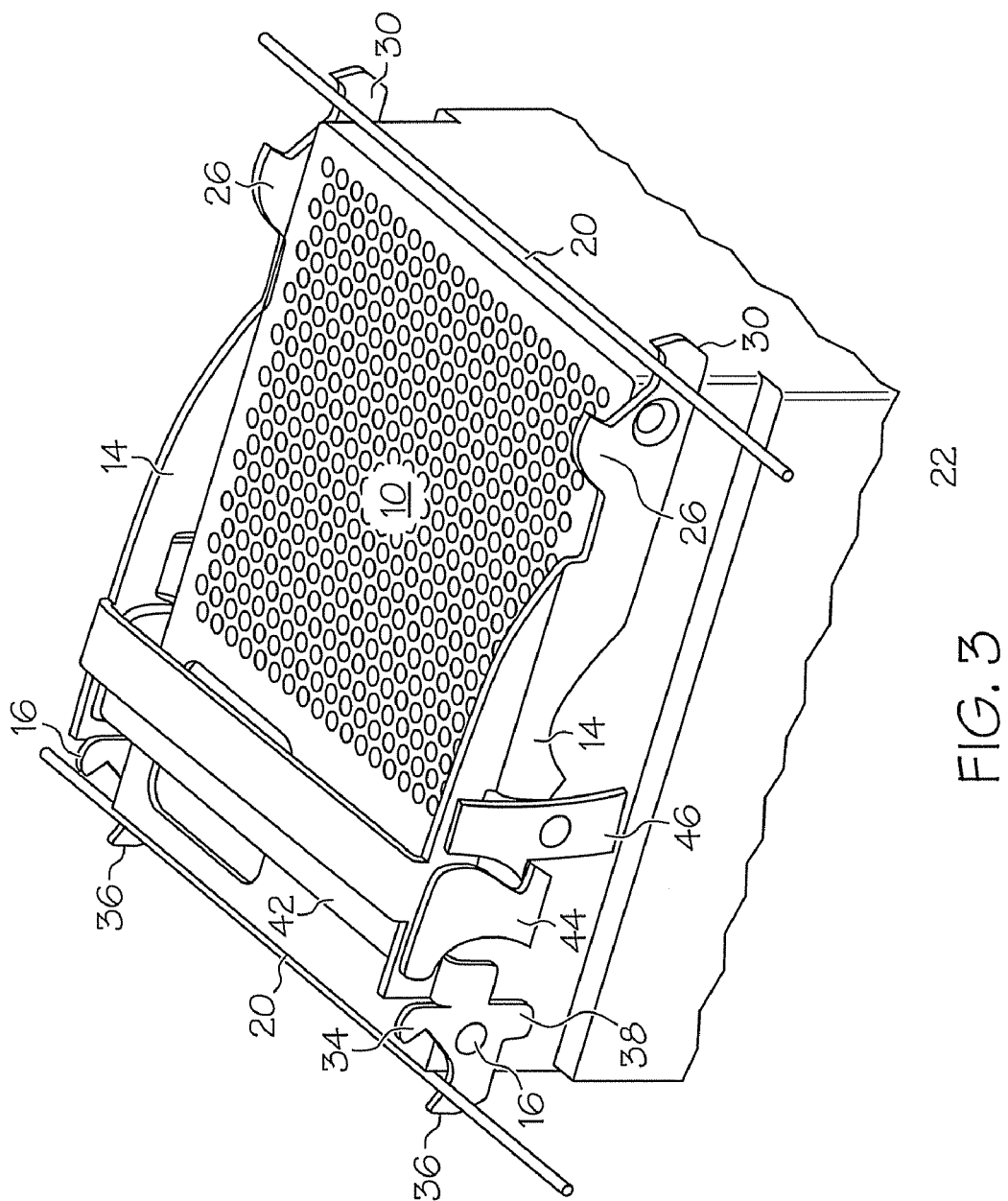
FIG. 3 illustrates the latch mechanism of FIG. 1 in the latched position.

As the rotation of the lever arm 14 is completed, as shown in FIG. 3, the cam lever 26 moves out of interference with the chassis opening 20. The lever arm 14, as it rotates, contacts a pawl tab 38 and forces the pawl 16 to rotate similarly moving the pawl stop 34 out of interference with the chassis opening 20. Moving the cam lever 26 and pawl stop 34 out of interference with the chassis opening 20 allows the module 10 to fully seat in the chassis opening 20. When the rotation of the lever arm 14 and the pawl 16 is complete, the lever hook 30 and pawl hook 36 are in position to interfere with the chassis opening 20, thus preventing the module 10 from being removed from or from falling out of the chassis opening 20.

Some embodiments of the latch mechanism 12 may include a spring loaded trigger 42 which includes a trigger hook 44, as shown in FIG. 3. When the lever arm 14 is in the latched position, the trigger hook 44 engages a module hook 46 thereby locking the lever arm 14 in the latched position. To unlatch the latching mechanism 14 and remove the module 10 from the chassis opening 20, the trigger 42 is moved out of engagement with the trigger hook 44 and the lever arm 14 is rotated away from the module 10. Rotating the lever arm 14 away from the module moves the lever hook 30 out of interference with the chassis opening 20. Because the pawl 16 attachment to the module 10 is spring loaded, as the lever arm 14 is rotated away from the pawl 16 the pawl 16 returns to the unlatched position and the pawl hook 36 out of interference with the chassis opening 20.

Utilizing the latch mechanism 12 to secure the module 10 in the chassis opening 20 secures the module 10 at multiple locations with a single rotation of the lever arm 14. This reduces time for assembly of the module 10 into the electronic component, and by securing the module 10 at multiple locations prevents the module 10 from being removed or falling out inadvertently.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A latch mechanism for securing a module in an electronic component chassis comprising:

two lever arms connected by a bridge and attached to the module, the lever arms rotable between a latched and unlatched position, at least a portion of the lever arm having an interference fit with the chassis when the lever arm is in the latched position;

two module hooks attached to the module;

two pawls rotably attached to the module such that when the lever arms are moved to the latched position, each lever arm rotates, contacting each pawl causing each pawl to rotate into a latched position wherein the pawl has an interference fit with the chassis;

wherein each lever arm includes a locking feature comprising a trigger hook engageable with the module hook to lock the latch mechanism in the latched position;

wherein the locking feature includes a spring loaded trigger to engage the trigger hook to the module hook and release the trigger hook from the module hook.

2. The latch mechanism of claim 1 wherein an attachment of at least one pawl to the module is spring loaded.

\* \* \* \* \*